United States Patent
Greiff et al.

(10) Patent No.: US 8,450,598 B2
(45) Date of Patent: May 28, 2013

(54) METHOD AND STRUCTURE FOR PROVIDING A UNIFORM MICRON/SUB-MICRON GAP SEPARATION WITHIN MICRO-GAP THERMOPHOTOVOLTAIC DEVICES FOR THE GENERATION OF ELECTRICAL POWER

(75) Inventors: Paul Greiff, Wayland, MA (US); Robert DiMatteo, Belmont, MA (US); Eric Brown, Cambridge, MA (US); Christopher Leitz, Watertown, MA (US)

(73) Assignee: MTPV Power Corporation, Austin, TX (US)

( * ) Notice: Subject to any disclaimer, the term of this patent is extended or adjusted under 35 U.S.C. 154(b) by 75 days.

(21) Appl. No.: 13/297,535

(22) Filed: Nov. 16, 2011

(65) Prior Publication Data

US 2012/0060883 A1    Mar. 15, 2012

Related U.S. Application Data

(62) Division of application No. 12/152,196, filed on May 12, 2008, now Pat. No. 8,076,569.

(51) Int. Cl.
*H01L 31/00*    (2006.01)
*H01L 35/00*    (2006.01)
*H01L 37/00*    (2006.01)
*H01L 35/34*    (2006.01)

(52) U.S. Cl.
USPC ................. 136/253; 136/200; 136/201

(58) Field of Classification Search
USPC ........................... 136/200, 201, 253
See application file for complete search history.

(56) References Cited

U.S. PATENT DOCUMENTS

| | | | |
|---|---|---|---|
| 4,234,352 | A | 11/1980 | Swanson |
| 5,685,363 | A | 11/1997 | Orihira et al. |
| 6,232,546 | B1 | 5/2001 | DiMatteo et al. |
| 2003/0034065 | A1 | 2/2003 | Meulenberg, Jr. |

FOREIGN PATENT DOCUMENTS

JP    06-027474    2/1994

OTHER PUBLICATIONS

Machine translation of JP06-027474, pub. Feb. 1994.

*Primary Examiner* — Jonathan Johnson
*Assistant Examiner* — Allison Bourke
(74) *Attorney, Agent, or Firm* — Taylor Russell & Russell, P.C.

(57) ABSTRACT

A near-field energy conversion method, utilizing a sub-micrometer "near-field" gap between juxtaposed infrared radiation receiver and emitter surfaces, wherein compliant membrane structures, preferably fluid-filled, are interposed in the structure for maintaining uniform gap separation. Thermally resistant gap spacers are also used to maintain uniform gap separation. Means are provided for cooling a receiver substrate structure and for conducting heat to an emitter substrate structure. The gap may also be evacuated for more effective operation.

24 Claims, 14 Drawing Sheets

METHOD AND STRUCTURE FOR PROVIDING A UNIFORM MICRON/SUB-MICRON GAP SEPARATION WITHIN MICRO-GAP THERMOPHOTOVOLTAIC DEVICES FOR THE GENERATION OF ELECTRICAL POWER

This application is a divisional of U.S. patent application Ser. No. 12/152,196, filed on May 12, 2008, which is incorporated herein by reference.

FIELD OF THE INVENTION

The present invention is concerned with the field of near-field devices for generation of electric current and power through transfer of energy from an emitter across a non-isothermal gap to a receiver, being more specifically directed to such devices using micron and submicron gap ("near-field") separations and the maintaining of the uniformity of the separation of such gaps between juxtaposed receiver and emitter structures for such use. These devices thereby achieve photocurrents many times those obtained in conventional ("far-field") devices, as described in U.S. Pat. Nos. 6,084,173 and 6,232,546, Patent Publication No. 2004/003172A1 of Nov. 25, 2004 and in a paper entitled "Micron-gap Thermo Photo Voltaic (MTPV)", DiMatteo et al, Proceedings of the Fifth TPV Conference, 2002, all incorporated herein by reference.

BACKGROUND OF THE INVENTION

There exists a class of novel electronic devices that utilize energy transfer between a relatively hot and a relatively cold surface when these surfaces are separated by a sub-micrometer gap. Collectively, this phenomenon is known as "near-field" energy transfer.

One such family of devices is micro-gap thermophotonics (MTPV) wherein a sub-micrometer gap is used between the emitter and the radiation receiver PV cell to achieve enhanced radiative transfer compared to conventional "far-field" (TPV) systems, as above indicated. Another such proposed class of devices utilizes Coulomb Coupling (CC) as described in U.S. Patent Publication 2008-0060694-A1 of Mar. 31, 2008 and of common assignee herewith. CC involves the transfer of electronic states from the hot surface to the cold surface through direct energetic coupling of hot-side and cold-side electrons. Both MTPV and CC can be used to generate energy and involve a relatively hot-side emitter and cold-side receiver separated by a gap, and these and related methods will be herein referred to as "near-field" systems.

There are, however, several challenges faced in attaining gap uniformity, caused by bowing or irregular surfaces, or applied external forces when manufacturing such near-field systems, particularly those that are to be capable of generating commercially significant (>1 KW) power levels. First, one must achieve a very small gap (sub-micrometer) and preferably with gap uniformity between the emitter and receiver surfaces. Secondly, this operation must be repeated many times to achieve an integrated system capable of achieving high power levels; the exact number of times depending upon the power level specified, the size of each individual receiver and emitter chip, and the power density and efficiency of the system. In some embodiments, indeed, the emitter and receiver surfaces may be heterogeneously integrated; whereas, in other embodiments, the emitter and receiver may be fabricated by one-chip monolithic integration techniques. In some embodiments, moreover, the formation of the sub-micrometer gap between the emitter and receiver may occur after these components have been fully and/or individually processed. In such embodiment, indeed, resulting bow and surface irregularities of each chip must be accommodated during assembly.

The present invention deals with structures and methods for overcoming these challenges through the use of appropriately compliant membranes, which preferably contain a fluid that applies compensatory pressure to the rear surface of the emitter, receiver, or both, and thereby helps accommodate for any non-uniformity in the gap between the emitter and receiver.

Such membrane usage also reduces the problem of external forces or pressures acting upon the assembled chip structure that can produce non-uniformity in such gap during use of the chip structures.

OBJECTS OF THE INVENTION

A primary object of the invention, therefore, is to provide a new and improved method of and structure for MTPV and CC operation that shall not be subject to the above-described or other prior art difficulties, but that, to the contrary, act to set and maintain gap uniformity in the photovoltaic chip in both its assembly and manufacture, and in use to generate power.

A further object is to attain these uniformity results through the use of preferably fluid-filled compliant membrane structures along the chip structure.

Other and further objects will be explained hereinafter and are more particularly pointed out in connection with the appended claims.

SUMMARY

In summary, however, the invention, in one of its important aspects, embraces in a near-field energy conversion device comprised of adjacent receiver and emitter chip substrate surfaces defining therebetween, respectively, relatively cool and hot inner sides of the device and bounding therebetween a gap or space of sub-micrometer order separation, a method of resisting external mechanical pressure-variation deformation of the cell surface(s) so as to enable the setting of and/or the maintaining of a predetermined value of substantially constant sub-micrometer order gap or space of separation, that comprises, covering the outer chip side of one or both cell chip substrate surfaces with a pressure-compliant membrane of thermally conductive material; and adjusting the thinness of the membrane to provide a flexing compliance adequate to compensate for said mechanical deformation.

Preferred and best mode realizations and design embodiments of the invention are hereafter described in detail.

DRAWINGS

Such now will be so described in conjunction with the appended drawings,

FIGS. 1 and 2 of which are enlarged fragmentary schematic transverse sections of prior art MTPV chip constructions and in which the problem of non-uniform gap is particularly illustrated in FIG. 2;

DESCRIPTION OF PREFERRED EMBODIMENTS OF INVENTION

Figure 1:
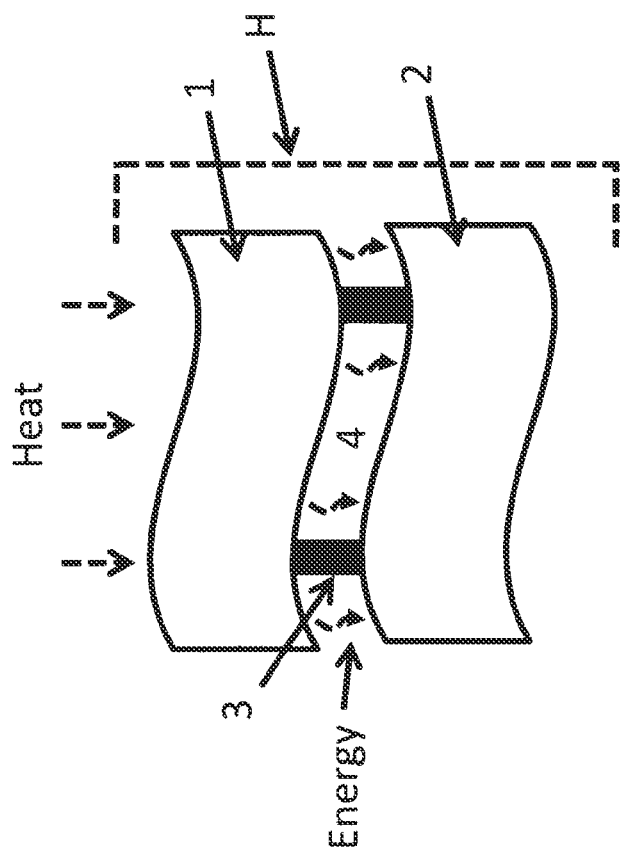

A general fragmentary schematic of a near-field system is presented in FIG. 1, comprised of a thermal emitter 1, a radiation receiver 2, one or more spacers 3, and a sub-micron gap 4, preferably in an evacuated housing H. The spacers define the size of the gap between the emitter and receiver and may be fabricated in either or both the emitter and receiver. The size of the gap is preferably less than one micron—for example, less than 100 nanometers. Incoming heat increases the temperature of the emitter 1 and causes it to emit energy. In MTPV, this energy takes the form of infrared radiation according to Planck's Law and is generally in the infrared (1-2 micrometer wavelength) regime. In CC, this energy takes the form of electrical fields active over very small distances (<100 nanometers). In either case, this radiation traverses the gap 4 and is absorbed by the receiver 2. In MTPV, the receiver 2 is a photocell. In CC, the receiver 2 may be one or more two-level quantum dots separated from a reservoir by a tunneling barrier and connected to a voltage source, as described in Patent Publication 2008-0060694-A1 of Mar. 31, 2008. In both cases, however, the receiver converts the energy that traverses the sub-micrometer gap to usable electrical power. The sub-micrometer gap 4 between the emitter and receiver enables efficient energy transfer from the emitter 1 to the receiver 2 when compared to the far-field regime, characterized by gaps greater than one micrometer, as before mentioned.

Figure 2:
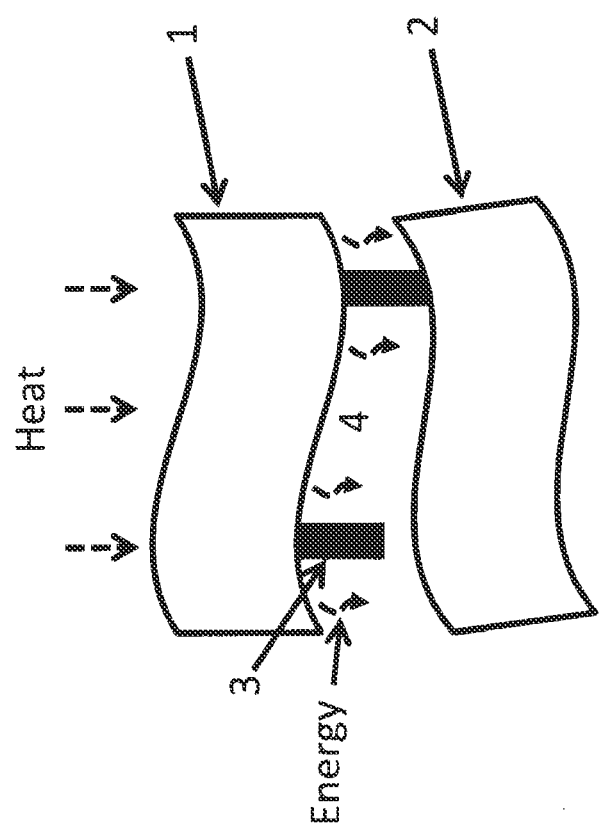
Figure 7:
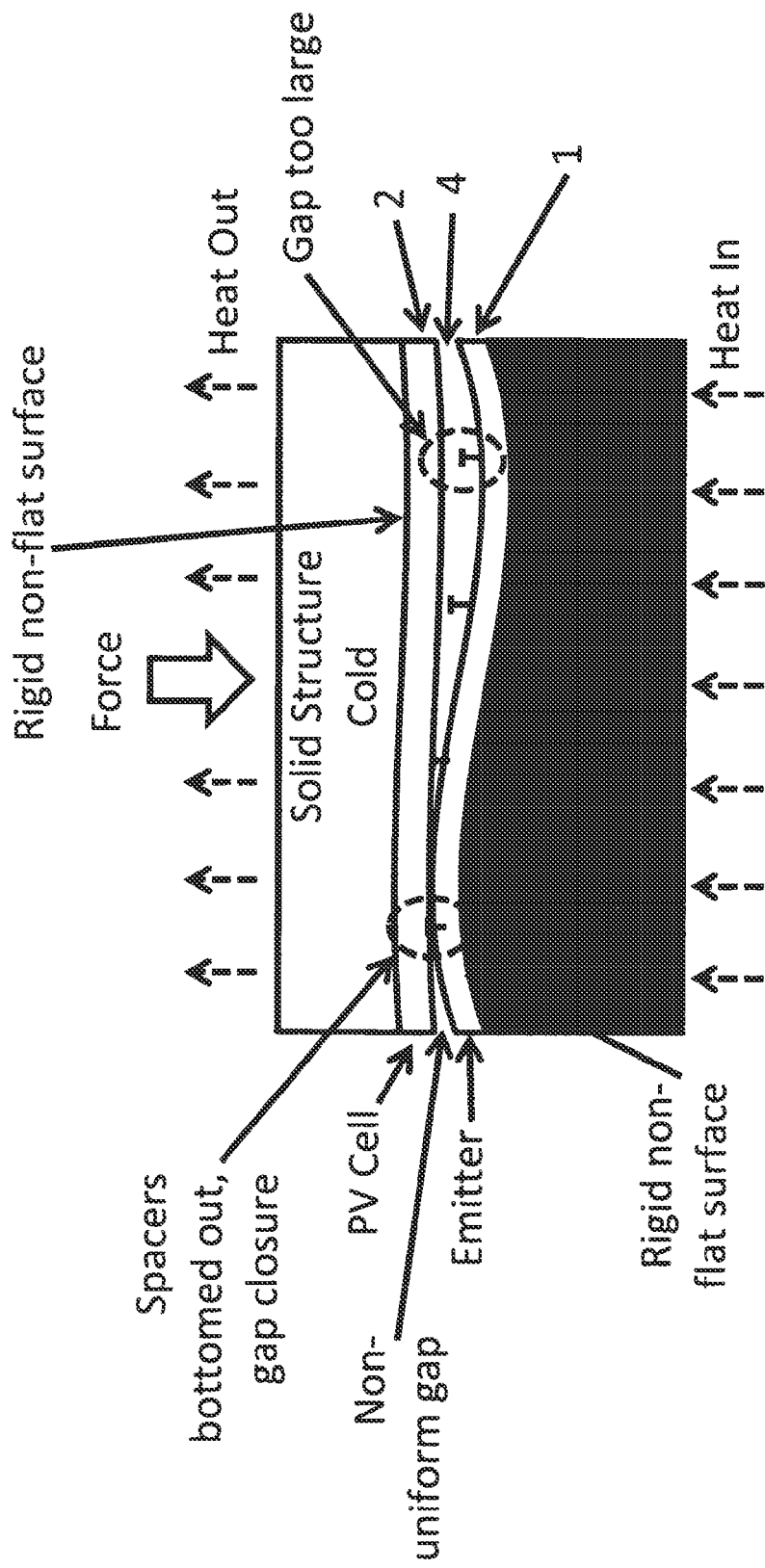
FIG. 7 is a larger fragmentary section also illustrative of gap non-uniformity of prior art structures utilizing spacer elements extending from the emitter layer.
Figure 8:
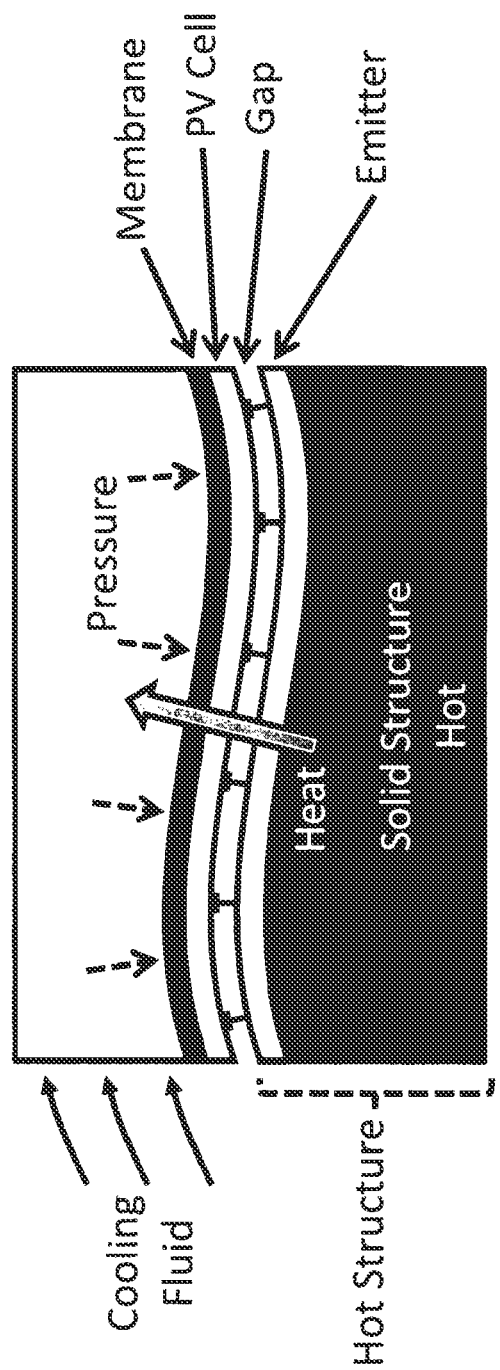
FIG. 8 shows the invention applied to the embodiment of FIG. 7 with the membrane layer interposed, but external to and along the outer surface of the receiver substrate.

In actual practice, a general characteristic of the emitter 1 and the receiver 2 is that their front and rear surfaces may not be perfectly flat or smooth, and the front and rear surfaces of an individual chip may not even be parallel to one another. Such a situation may arise from, for example, non-uniform starting materials, from stresses induced during processing, or from non-uniformities induced during processing (e.g., in film thickness or etch depth). As a result, though the array of spacers 3 may be extremely uniform in height, the gap 4 may not be uniform. In some instances, moreover, the gap 4 may be sufficiently non-uniform that the spacers do not in places make direct contact with the opposite surface, as depicted schematically in FIG. 2. Referring to this figure (and FIGS. 7 and 8), the spacers 3 are there depicted as fabricated on the emitter 1, and some spacers do not make direct contact with the receiver 2 because of such non-uniformities in the surface of either or both the emitter or receiver. The resulting width of the gap 4 is then also non-uniform. During use, moreover, external pressure and force may produce gap non-uniformities.

Figure 9A:
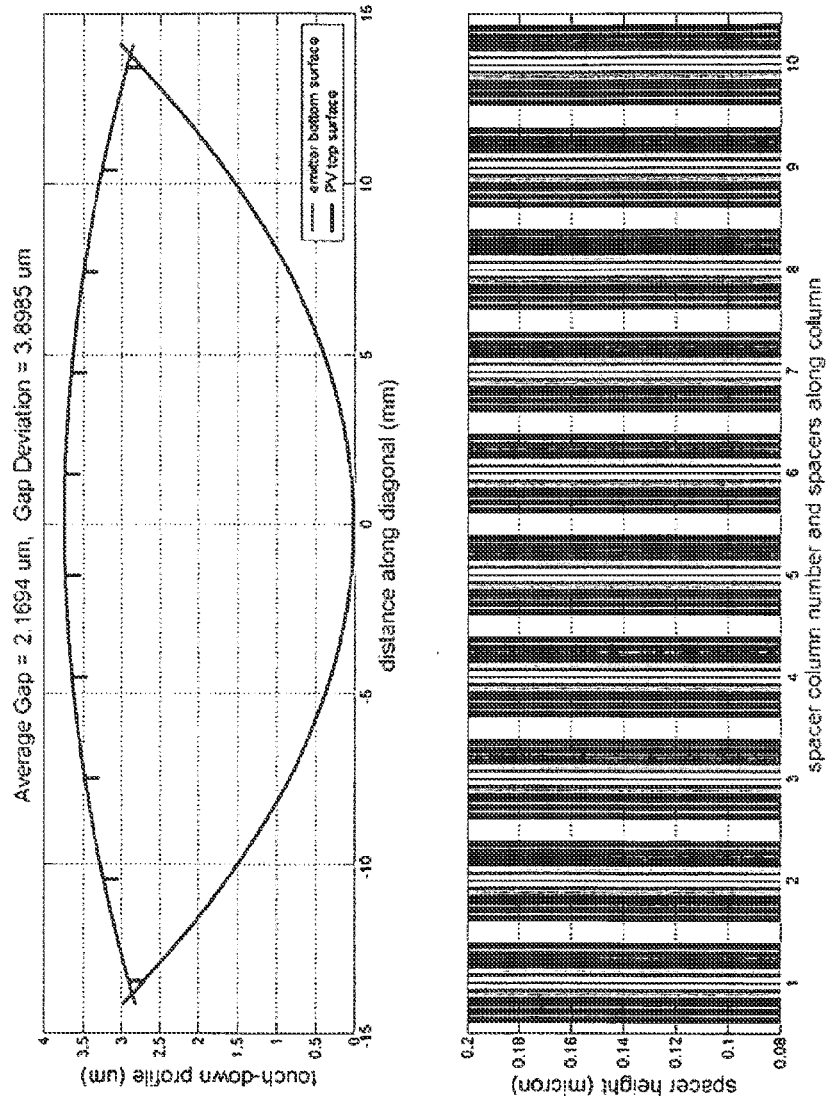
FIGS. 9A-9F are successive schematic views illustrating successive degrees of compliant operation of the membrane structures in response to external pressure forces.
Figure 9B:
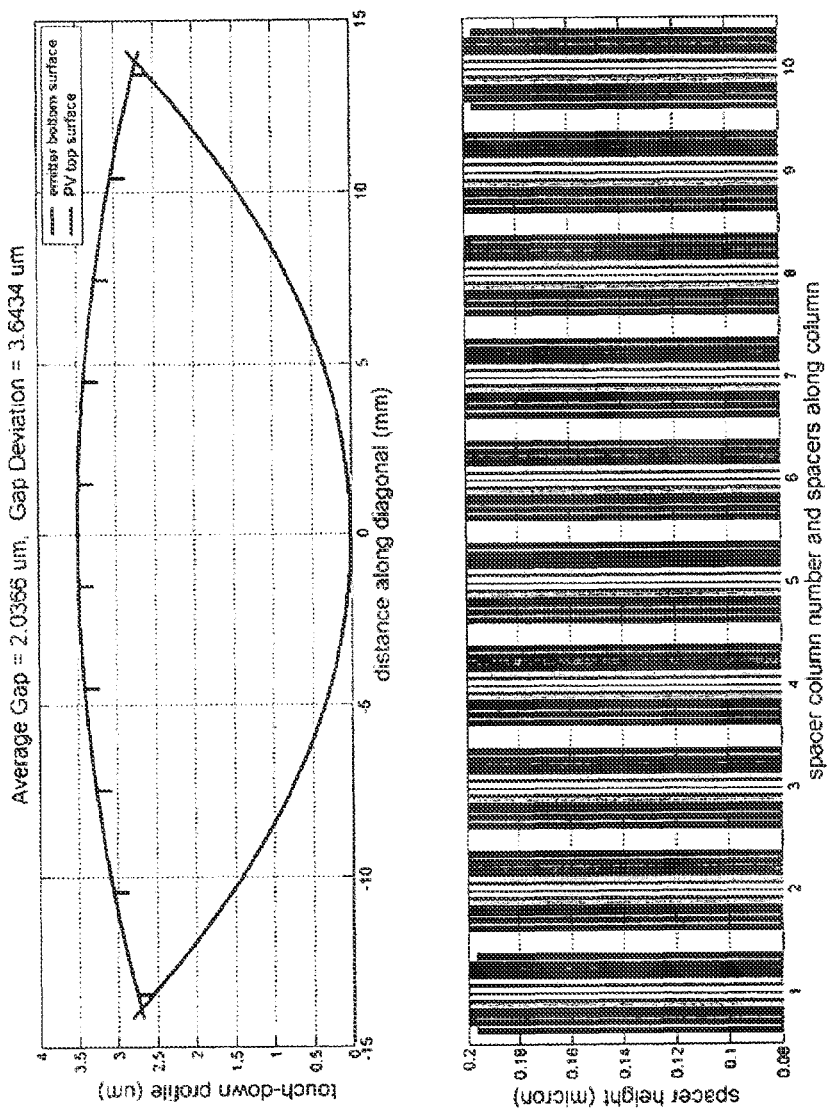
Figure 9C:
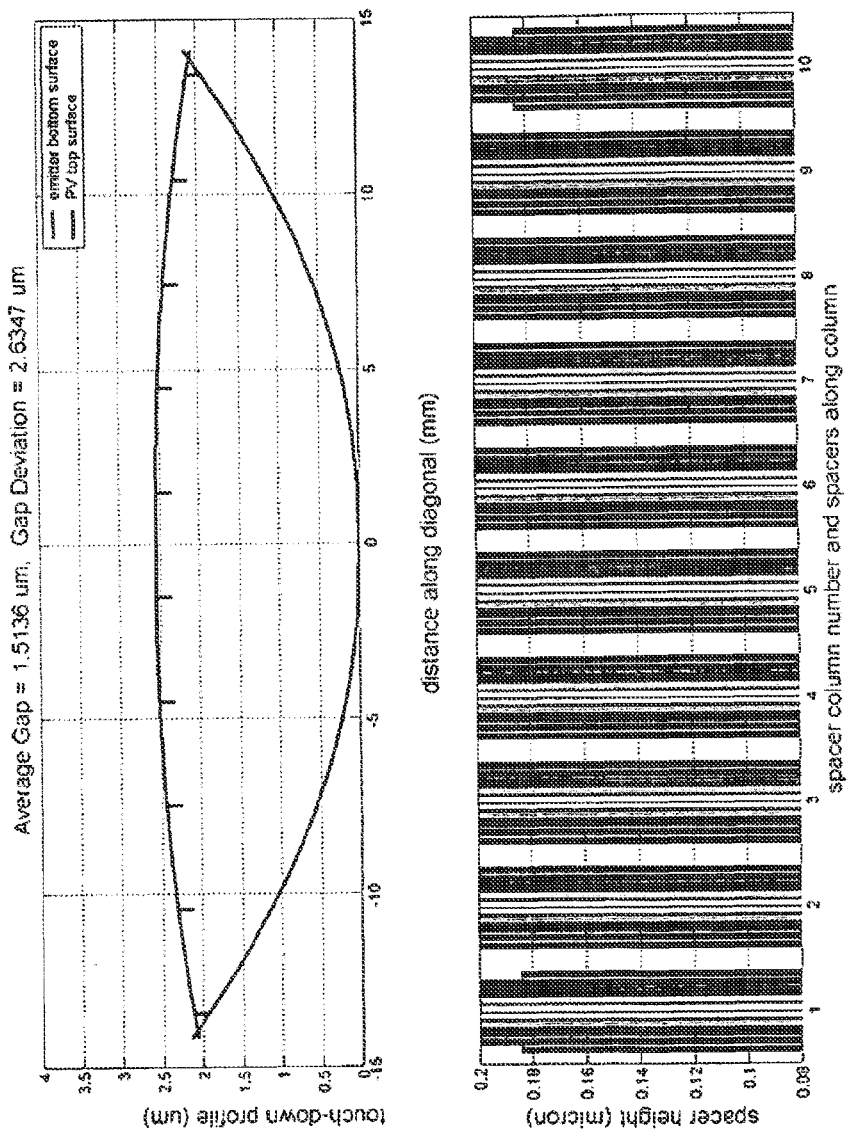
Figure 9D:
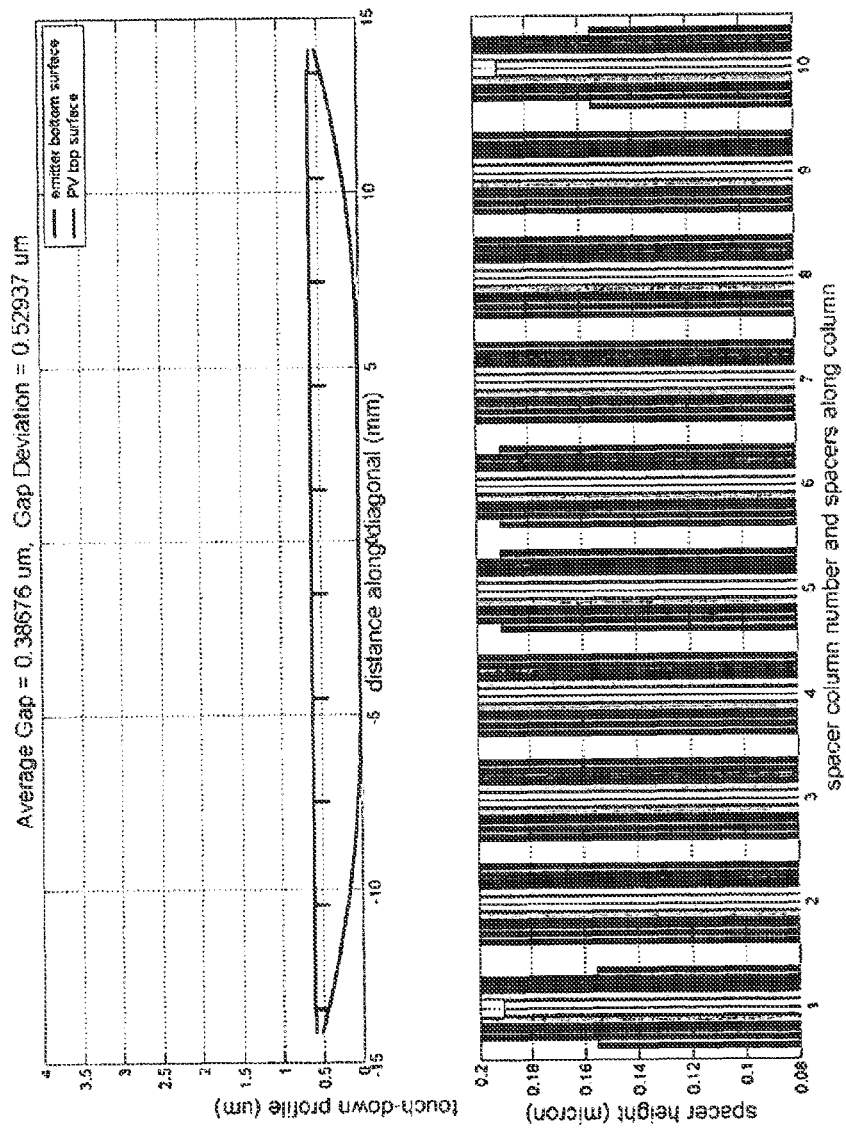
Figure 9E:
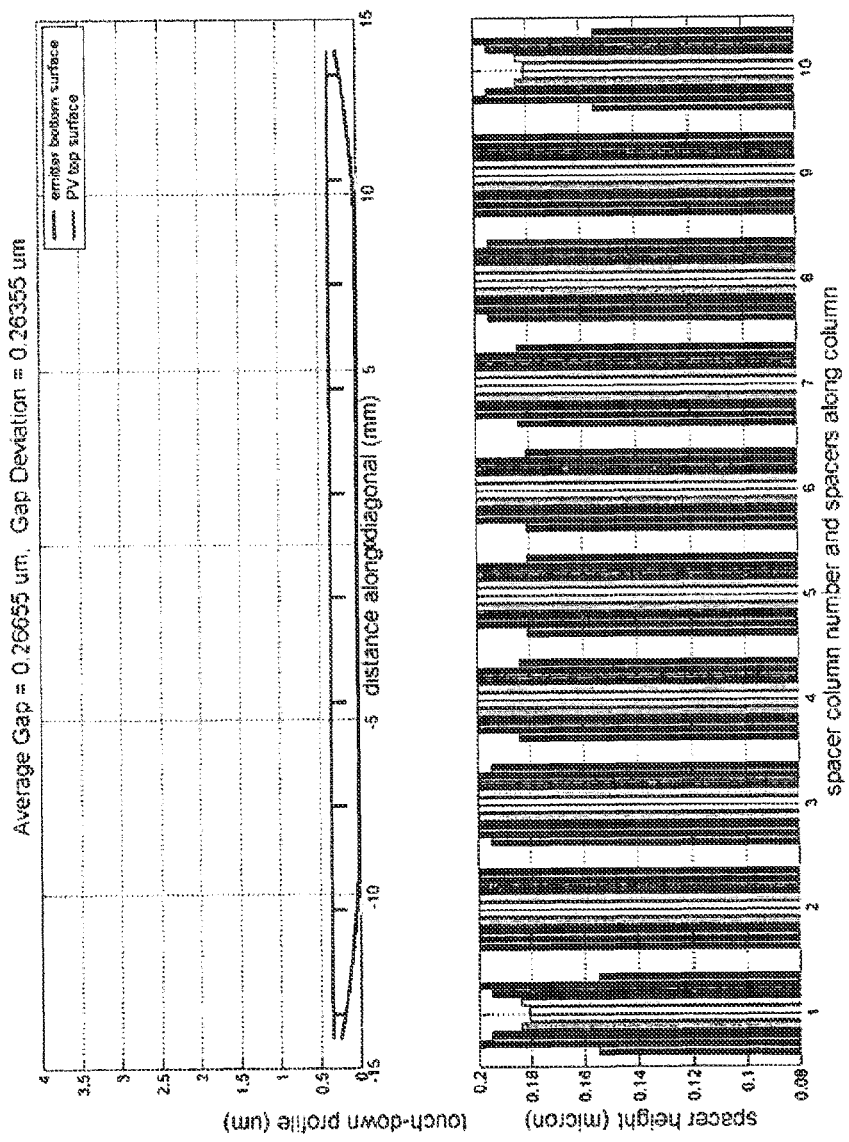
Figure 9F:
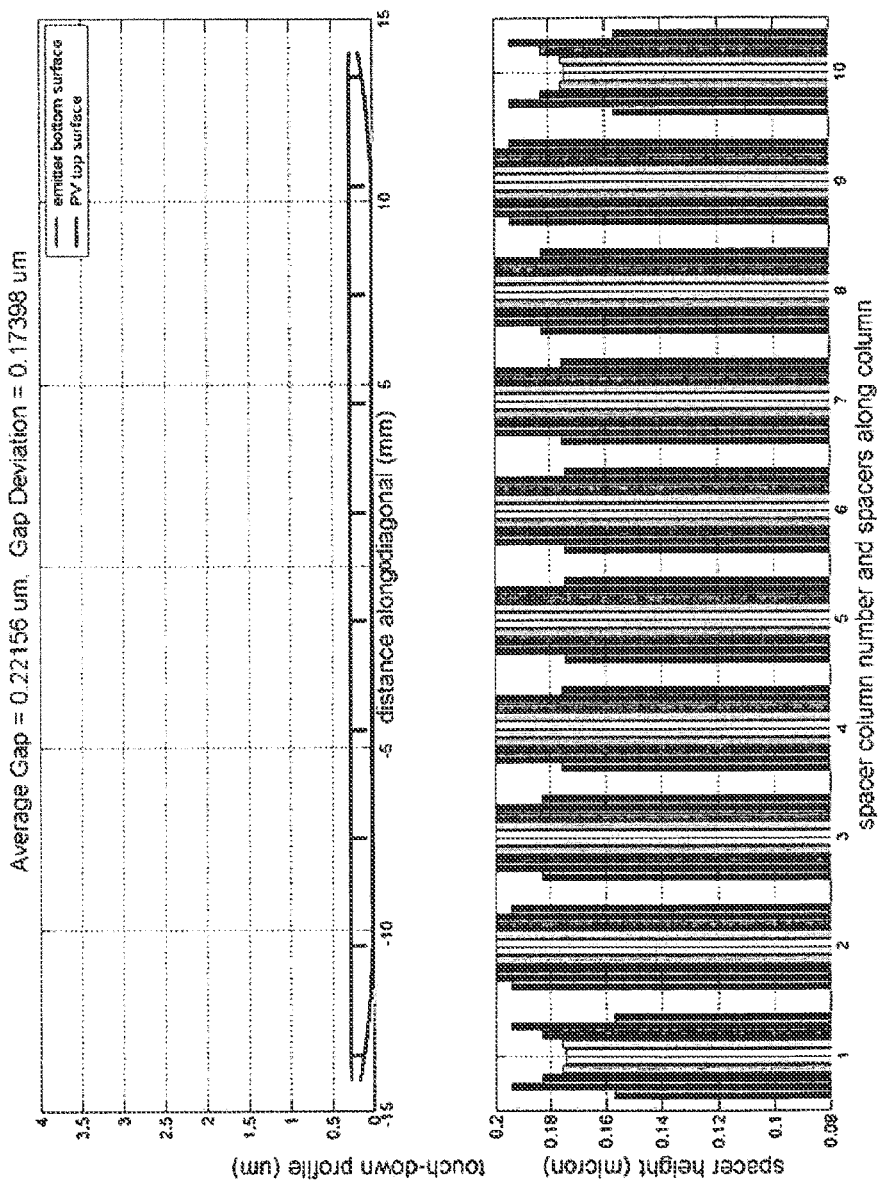

The effects of applying a force, such as through a membrane, to create a more uniform gap are illustrated in Figured 9(a)-9(f). In these figures, the top graph indicates a cross-sectional schematic of a 20 mm square emitter-receiver pair along the diagonal. The bottom graph indicates the average height of spacers in each row and column. The spacers are, for example, nominally 0.2 microns but are capable of compliance when external force is applied. In the upper graph, the emitter is modeled as the top line, with spacers indicated by vertical lines. The receiver, in this case a photovoltaic cell (PV), is modeled as the bottom line. In FIG. 9(a), the emitter and PV cell are bowed in opposite directions, causing a non-uniform gap with an average size greater than two micrometers. Most of the spacers do not touch the PV cell surface. As more force is applied, as indicated sequentially in FIGS. 9(b)-9(f), the gap decreases and becomes more uniform, as measured by the standard deviation in gap size across the diagonal.

For optimal near-field system performance, a uniform gap is desirable. For example, in MTPV, a uniform gap leads to uniform illumination of the PV cell receiver, minimizing local areas of high current density in the PV cell and therefore minimizing series resistance and heating losses within the PV cell. A uniform gap 4 also generally enables uniform power generation, leading to more controlled specifications in the end product and lower yield losses due to products failing to conform to specification limits.

While a more uniform sub-micrometer gap may be achieved by using flat starting materials for emitter and receiver substrate surfaces and carefully controlling bow and warp during formation of the respective layers, the present invention enables the attaining of a more uniform gap by applying external flexibly compliant and compensatory pressure to either or both the receiver and emitter preferably by an interposed fluid-filled membrane structure.

Figure 3:
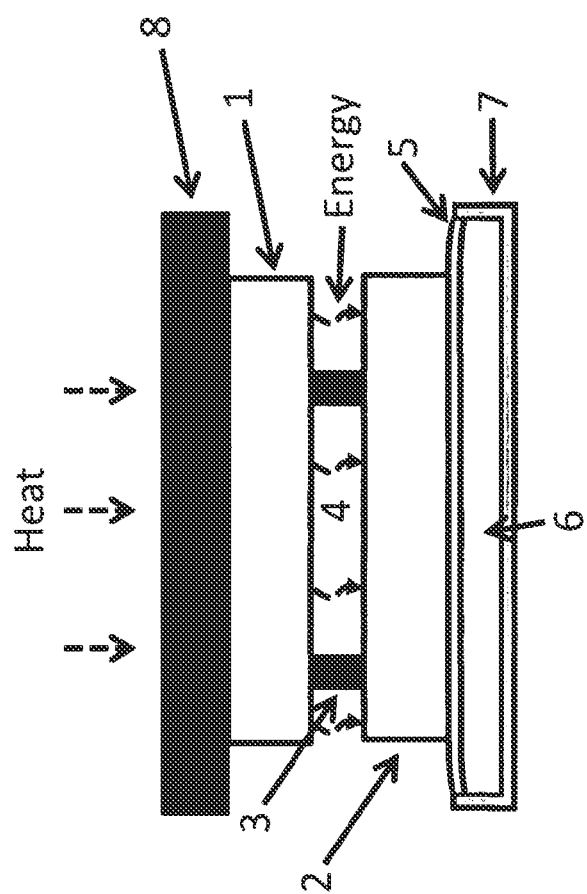
FIG. 3 is a similar diagram illustrating the use of the preferred compliant fluid membrane structure assembled on the receiver side.

Referring to FIG. 3, a detailed schematic is there illustrated of such a near-field system utilizing such a fluid-filled membrane structure wherein the receiver 2 sits upon the fluid-filled membrane structure 5 and its cooling chamber 6, both of which are secured in a frame housing 7. In this embodiment, the housing 7 is preferably made of materials with high thermal conductivity, such as copper (Cu), which helps enable the receiver to remain relatively cool. The cooling chamber 6 typically incorporates a continuous flow of a coolant, such as water or air, to ensure active cooling of the receiver 2. A top support 8 ensures that pressure applied through the membrane results in the application of a compressive force through the gap 4, in the absence of which, the emitter will otherwise simply shift to accommodate for the pressure exerted by the membrane. The support 8 is preferably made of a material that can maintain its integrity at high temperatures, such a copper (Cu), Hastelloy™, steel, or ceramic. In some embodiments, the support may incorporate active elements such as springs (not shown) that are capable of supplying a compressive force to the rear of the emitter.

Figure 4:
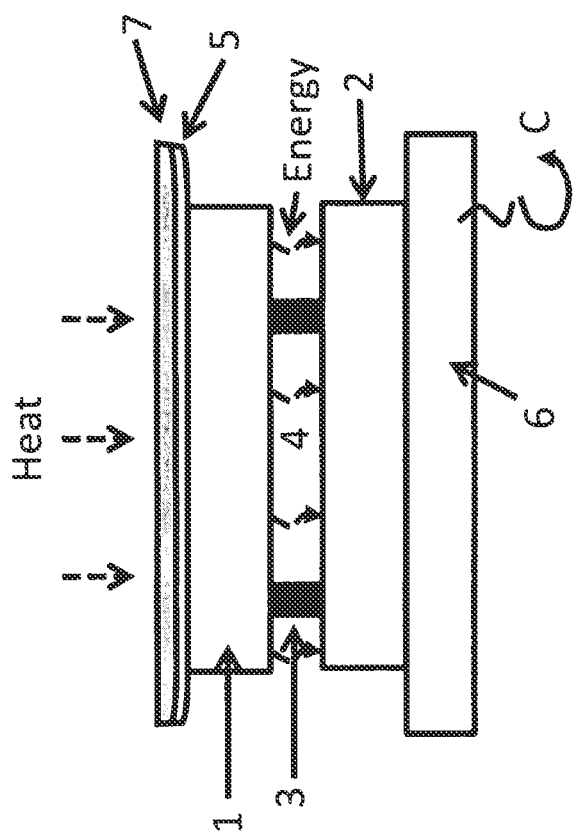
FIG. 4 is a similar fragmentary diagram of the invention, shown with the fluid membrane mounted on the emitter side of the chip structures.

The membrane structure 5 in FIG. 3 is assembled on the relatively cold photocell receiver side of the MTPV chip. In FIG. 4, on the other hand, the system is shown utilizing a relatively hot side membrane 5, wherein the receiver 2 sits upon the cooling chamber 6 which, as earlier mentioned, typically incorporates a continuous-flow coolant to ensure active cooling of the receiver. The membrane 5 is shown composed of a continuous wall enclosing a fluid and secured in a housing 7 that ensures that the pressure applied through the membrane results in the application of a compressive force through the gap 4. The fluid in this case exerts pressure to the rear of the emitter 1 and may, for example, be air, water, or a liquid metal such as indium (In) or gallium (Ga). The walls of the membrane should be sufficiently thin, in the range of 1-1000 micrometers, to ensure flexible compliance and uniform loading of the receiver surface. The walls of the membrane may preferably comprise such materials as the before-mentioned copper (Cu) or beryllium (Be). In this embodiment, the walls and fluid of the membrane must be able to withstand the temperature of the "hot" side of the chip.

A dual architecture composed of both MTPV hot-side and cold-side membranes may be employed, again with the membrane 5 preferably composed of a continuous wall enclosing a fluid, as in FIGS. 3 and 4. The fluid exerts pressure to the rear of the receiver, and in addition to air or water, may also be of a liquid metal such as the before-mentioned indium (In) or gallium (Ga). The walls of the membrane should be sufficiently thin, preferably in the range of 1-1000 micrometers, to ensure compliance and uniform loading of the receiver surface. The walls of the membrane may also comprise such materials as the copper (Cu) or beryllium (Be) before-described. The pressure within the membrane structure may be maintained or regulated via recirculation of the fluid within the walls of the membrane, schematically shown by arrow C, where the pressure is then a function of the flow rate within the walls of the membrane.

Referring again to the embodiment of FIG. 3, the membrane 5 and cooling chamber 6 may be formed as a single entity. In this case, the membrane and cooling chamber assume a dual function since the pressure exerted by the membrane then becomes a function of the flow rate of coolant through the dual membrane 5/cooling chamber 6.

In the embodiments of FIGS. 1, 3 and 4, the emitter surface 1 may be made of, for example, silicon (Si), titanium (Ti), tungsten (W), silicon nitride ($Si_3N_4$), or silicon carbide (SiC); preferably embodying a material with high emissivity to ensure maximum power transfer across the sub-micrometer gap 4. The emitter also preferably exhibits a low rate of sublimation at its operating temperature. In some embodiments, moreover, the emitter may comprise an array of semiconductor quantum dots.

As for spacers 3, these may be made of, for example, silicon dioxide ($SiO_2$), alumina ($Al_2O_3$), or silicon nitride ($Si_3N_4$). The spacers preferably exhibit low thermal conductivity to ensure that a substantial fraction of the heat transfer from emitter to receiver is not by thermal conduction. The receiver 2 may comprise, for example, semiconductor elements germanium (Ge) and silicon (Si), or may comprise gallium (Ga), antimony (Sb), indium (In), phosphorus (P), arsenic (As), mercury (Hg), cadmium (Cd), lead (Pb), tellurium (Te), or selenium (Se). In other embodiments, the receiver may be comprised of one or more semiconductor quantum dots connected to a voltage source as in the before-referenced CC structures.

Figure 5:
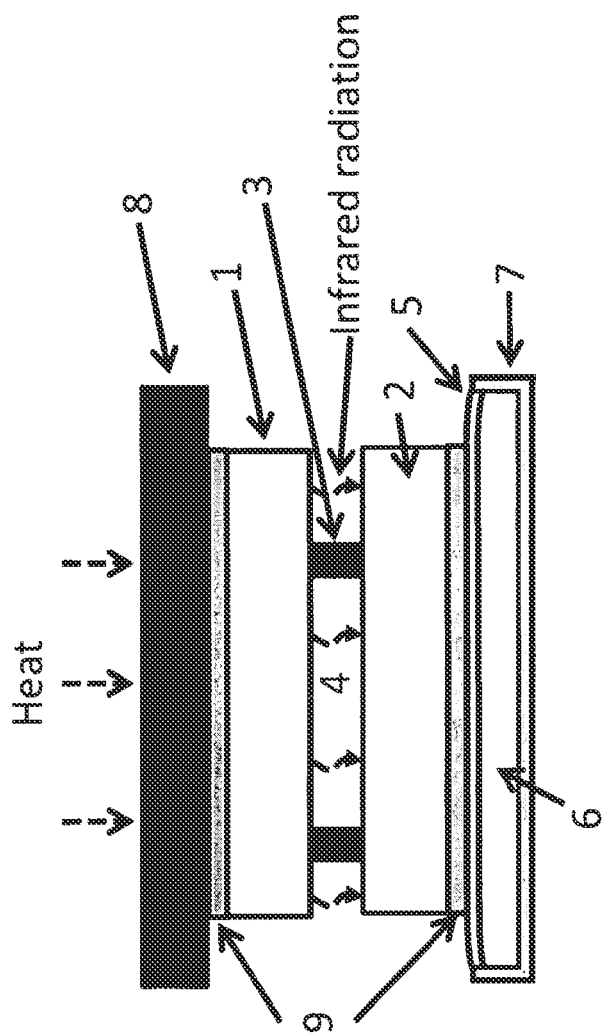
FIGS. 5 and 6 show modifications using interposed additional compliant layers, external to and internal of the fluid chamber, respectively.

In still other embodiments, additional compliant layers may also be utilized to facilitate assembly and operation. For example, these compliant layers may be used in mounting either or both the emitter and receiver and ensuring that force applied by the membrane is equally distributed. In FIG. 5, illustrating a cold-side membrane, the compliant layers 9 are shown inserted between the emitter 1 and support 8 and between the receiver 2 and membrane 5. In the former case, between the emitter and support, the compliant layer also ensures efficient heat transfer between the two layers and can withstand high temperatures. In this case, the compliant layer may be composed of material marketed under the trade name eGRAF™. In the latter case, between the receiver and membrane, the compliant exhibits high thermal conductivity to ensure efficient cooling of the receiver. In this case, the compliant layer may be composed of thermal grease such as brand T-gon™. A similar use of compliant layers can be undertaken in the case of the hot-side membrane.

Figure 6:
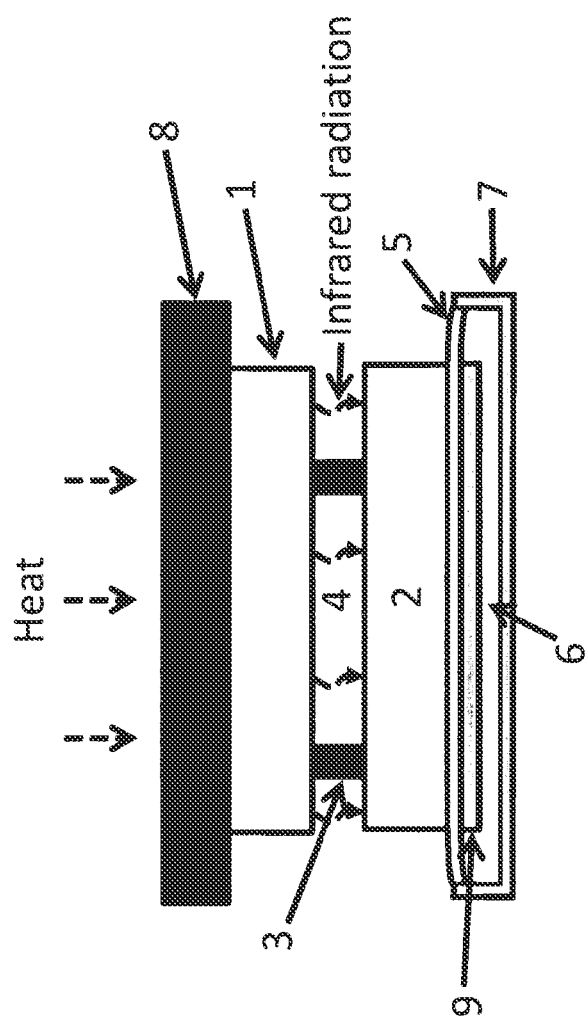

In some embodiments, furthermore, an additional stress-compensating layer may be inserted inside the walls of the membrane structure to ensure that the pressure exerted by the membrane does not result in deleterious deformation of the receiver or emitter surfaces. Referring to FIG. 6 that illustrates a cold-side membrane, for example, a stress-compensating layer 9 is shown inserted within the fluid-filled membrane 5. This stress-compensating layer ensures that the pressure exerted by the membrane does not result in deformation of the receiver (for cold-side membrane architectures) or the emitter (for hot-side membrane architectures). The stress-compensating layer is preferably made of the same material as the layer for which it compensates. For example, in FIG. 6, the stress-compensating layer 9 and receiver 2 may be of substantially the same material.

Further modifications will also occur to those skilled in the art; and such are considered to fall within the spirit and scope of the invention as defined in the appended claims.

The invention claimed is:

1. A method for near-field energy conversion, comprising:
    juxtaposing a relatively hot inner surface of a thermal emitter substrate and an adjacent relatively cool inner surface of a radiation receiver substrate;
    separating the juxtaposed relatively hot inner surface of the thermal emitter substrate and the adjacent relatively cool inner surface of the radiation receiver substrate by a gap of less than one micron;
    covering an outer surface of the thermal emitter substrate opposite the hot inner surface with an emitter membrane structure of pressure-compliant thermally conductive material and covering an outer surface of the radiation receiver substrate opposite the cool inner surface with a receiver membrane structure of pressure-compliant thermally conductive material;
    setting and maintaining uniformity of the gap, and providing thermal conductivity between impinging radiation and the outer surface of the thermal emitter substrate by the emitter membrane structure; and
    setting and maintaining uniformity of the gap, and providing cooling to the outer surface of radiation receiver substrate by the receiver membrane structure.

2. The method of claim 1, further comprising assembling the receiver membrane structure and the outer surface of the radiation receiver substrate in a frame secured along the periphery of the radiation receiver substrate.

3. The method of claim 2, wherein the frame includes an internal cavity chamber extending along the receiver membrane structure.

4. The method of claim 3, wherein a coolant is passed through the internal cavity chamber.

5. The method of claim 1, further comprising positioning an array of thermally resistant gap spacers in the gap between the relatively hot inner surface of the thermal emitter substrate and the relatively cool inner surface of the radiation receiver substrate.

6. The method of claim 1, further comprising evacuating the gap between the relatively hot inner surface of the thermal emitter substrate and the relatively cool inner surface of the radiation receiver substrate.

7. The method of claim 1, further comprising positioning a single emitter compression support layer on the outer surface of the thermal emitter substrate.

8. The method of claim 7, further comprising maintaining gap uniformity by the single emitter compression support layer by applying a rigid external pressure to the outer surface of the thermal emitter substrate.

9. The method of claim 1, further comprising positioning a single receiver compression support layer on the outer surface of the radiation receiver substrate.

10. The method of claim 9, further comprising maintaining gap uniformity by the single receiver compression support layer by applying a rigid external pressure to the outer surface of the radiation receiver substrate.

11. The method of claim 1, further comprising enclosing a pressure-exerting fluid by a wall comprising the emitter membrane structure and the receiver membrane.

12. The method of claim 11, further comprising exerting a pressure by the emitter membrane structure on the outer surface of the thermal emitter substrate that is a function of a coolant flow rate in the emitter membrane structure resulting in a compressive force through the gap.

13. The method of claim 11, further comprising exerting a pressure by the receiver membrane structure on the outer surface of the radiation receiver substrate that is a function of a coolant flow rate in the receiver membrane structure resulting in a compressive force through the gap.

14. The method of claim 1, further comprising positioning a cool side compliant layer between the outer surface of the radiation receiver substrate and the receiver membrane structure to ensure efficient cooling of the radiation receiver substrate, and positioning a hot side compliant layer between the outer surface of the thermal emitter substrate and the membrane structure to ensure efficient heat transfer to the thermal emitter substrate.

15. The method of claim 1, further comprising positioning a hot side compliant layer between the outer surface of the thermal emitter substrate and the membrane structure to ensure efficient heat transfer to the thermal emitter substrate.

16. The method of claim 7, further comprising positioning a hot side compliant layer between the emitter compression support layer and the outer surface of the thermal emitter substrate to ensure efficient heat transfer to the thermal emitter substrate.

17. The method of claim 9, further comprising positioning a cool side compliant layer between the receiver compression support layer and the outer surface of the radiation receiver substrate to ensure efficient cooling of the radiation receiver substrate.

18. The method of claim 1, further comprising positioning an emitter stress-compensating layer of substantially the same material as the thermal emitter substrate, within the emitter membrane structure to ensure that a pressure exerted by the emitter membrane structure does not result in deformation of the thermal emitter substrate.

19. The method of claim 1, further comprising positioning a stress-compensating layer of substantially the same material as the radiation receiver substrate, within the receiver membrane structure to ensure that a pressure exerted by the receiver membrane structure does not result in deformation of the radiation receiver substrate.

20. The method of claim 1, further comprising adjusting a thickness of the emitter membrane structure to provide a flexing compliance to compensate for mechanical deformation of the thermal emitter and radiation receiver substrates.

21. The method of claim 1, further comprising adjusting a thickness of the receiver membrane structure to provide a flexing compliance to compensate for mechanical deformation of the thermal emitter and radiation receiver substrates.

22. The method of claim 1, wherein the radiation receiver comprises a PV cell.

23. The method of claim 1, wherein the thermal emitter comprises an array of quantum dots.

24. The method of claim 1, wherein the radiation receiver and thermal emitter comprise an MTPV system.

* * * * *